United States Patent [19]

Agur

[11] Patent Number: 5,337,213

[45] Date of Patent: Aug. 9, 1994

[54] BULL NOSE EXTRACTION FEATURE FOR THIN FORM FACTOR COMPUTER CARD

[75] Inventor: Philip J. Agur, Caren Park, Calif.

[73] Assignee: Intel Corporation, Santa Clara, Calif.

[21] Appl. No.: 990,896

[22] Filed: Dec. 15, 1992

[51] Int. Cl.⁵ .................. H05K 7/10; G06F 1/16; H01R 13/62

[52] U.S. Cl. ..................... 361/684; 439/160

[58] Field of Search ............. 439/76, 152, 159, 160; 235/475, 479, 480, 482, 492; 361/684, 724–730, 737

[56] References Cited

U.S. PATENT DOCUMENTS 5,207,586  5/1993  MacGregor et al. ................ 439/76

FOREIGN PATENT DOCUMENTS 91-00681  1/1991  World Int. Prop. O. ............ 439/76

Primary Examiner—Leo P. Picard
Assistant Examiner—Michael W. Phillips
Attorney, Agent, or Firm—Blakely, Sokoloff, Taylor & Zafman

[57] ABSTRACT

Many computer systems, notably notebook computers, contain extraction trays to extract a thin form factor computer card which has been inserted into a card slot of the computer. A bull nose extraction feature of a thin form factor computer card increases the effective strength of an extraction tray. This is accomplished by changing the host-end snout of the card to have a bull nose, rather than one that necks down to match the mating pin connector. The bull nose extraction feature engages the extraction tray significantly closer to the bend intersection of the extractor tabs of the extraction tray. This effectively shortens the moment arm with which the card exerts a potentially damaging force on the extraction tray.

17 Claims, 8 Drawing Sheets

_5,337,213_

BULL NOSE EXTRACTION FEATURE FOR THIN FORM FACTOR COMPUTER CARD

BACKGROUND OF THE INVENTION

1. Field of the Invention

The present invention relates to peripheral cards for computer systems. More specifically, the present invention implements a method and apparatus for reliable extraction of thin form factor computer cards from a computer system.

2. Art Background

It is quite common for computer systems, notably notebook computers, to have a slot into which may be inserted a thin form factor memory cartridge. A "memory cartridge" is a plug-in module containing random access memory (RAM) chips that can be used to store data or programs. Memory cartridges are used primarily in portable computers as smaller, lighter, substitutes for disk drives. Memory cartridges typically use a nonvolatile form of RAM which does not lose its contents when power is turned off, or battery-backed RAM, which maintains its contents by drawing current from a rechargeable battery within the cartridge.

To encourage the development of memory cartridges, various standards have been established. One such standard was established by the Personal Computer Memory Card Industry Association (PCMCIA). However, other standards exist, for example, in Japan, JEIDA is the equivalent association to PCMCIA.

The PCMCIA PC Card Standard 2.0 outlines the architecture and specifications for an interchangeable integrated circuit card, with both data storage ("memory") and peripheral expansion ("I/O") card types defined. Cards, which conform to the PCMCIA Standard 2.0, interface through a standard 68-pin connector to operate interchangeably in the same 68-pin slot of a host computer system.

However, the PCMCIA standard, by itself, does not guarantee interoperability. While the PCMCIA standard establishes some electrical and software requirements, these requirements are not stringent enough to guarantee that a PCMCIA card will function properly in every manufacturer's PCMCIA slot. Primarily, the PCMCIA standard defines physical specifications for an interchangeable card. For example, PCMCIA Standard 2.0 specifies that the width and length of a card must be exactly the same size as that of a credit card. Furthermore, while the thickness is specified to be 130 thousandths of an inch (3.3 millimeters) along the edge of the card, the center area of the card is allowed to have a maximum thickness of 197 thousandths of an inch (5 millimeters).

Because of the small size and light weight of PCMCIA cards, they are quite popular and a variety of PCMCIA Standard 2.0 card devices are now, or will soon be, available. Examples of PCMCIA card devices include memory devices such as RAM, dynamic RAM (DRAM), and flash memory storage products. Examples also include I/O devices such as modem, facsimile (fax), local area network (LAN), small computer system interface (SCSI) and wireless I/O cards. Significant numbers of computers which have PCMCIA card slots, as well as, significant numbers of the cards themselves, have been manufactured. These computer systems and cards are either on the market, or have already been sold. Furthermore, it is anticipated that many more such computer systems and cards will ultimately be manufactured and sold.

Cards built according to the PCMCIA PC Card Standard 2.0 have a propensity to jam the card slot of a computer system when an ejection of the card from the card slot is attempted. Usually, when a card jams a card slot, the computer system must be disassembled by a qualified technician to extract the jammed card. At best, a jammed card degrades the utility of the computer system. At worst, a card jammed in a slot will either ruin the computer system, or render the system unusable.

SUMMARY OF THE INVENTION

It is therefore an object of the present invention to provide a thin form factor computer cartridge which will not jam the computer cartridge slot of a computer system when the cartridge is ejected from the slot.

It is a further object of the present invention to provide a thin form factor computer cartridge which reliably ejects from the cartridge ejection mechanism of existing computer systems without requiring modification of the cartridge ejection mechanism.

It is a further object of the present invention to provide a thin form factor computer cartridge which reliably ejects from the cartridge ejection mechanism of existing computer systems without deviating significantly from the PCMCIA 2.0 computer cartridge standard.

It is a further object of the present invention to retrofit a thin form factor computer cartridge built to the PCMCIA Standard 2.0, which has a propensity towards jamming upon ejection, so that it will eject reliably without jamming.

It is an object of the present invention to satisfy the above-mentioned objects of the present invention in a way that maintains the small size and light weight characteristics of the thin form factor card.

Furthermore, it is an object of the present invention to satisfy the abovementioned objects of the present invention in a way which is inexpensive to implement.

Many computer systems, notably notebook computers, contain ejection trays to extract a thin form factor computer card which has been inserted into a card slot of the computer. An apparatus and method is disclosed for providing a thin form factor computer card with a bull nose ejection feature to increase the effective strength of the ejection tabs of at, extraction tray. By increasing the ejection tab strength, the propensity of the computer card to bend the ejection tabs and thereby lodge the computer card in the card slot of the computer is eliminated. Thus, computer cards are reliably extracted from the computer card slot without jamming.

The bull nose feature is implemented by changing the host-end snout of the card to have a bull nose, rather than one that necks down to match the mating pin connector. The bull nose extraction feature engages the ejection tabs significantly closer to the bend intersection of the extraction tray ejection tabs. This effectively shortens the moment arm with which the card exerts a potentially damaging force on the host notebook extraction tray.

BRIEF DESCRIPTION OF THE DRAWINGS

The objects, features and advantages of the method and apparatus of the present invention will be apparent from the following detailed description of the invention in which.

DETAILED DESCRIPTION OF THE INVENTION

An apparatus and method is disclosed for increasing the extraction reliability of a thin form factor computer cartridge. In the following description, for the purposes of explanation, specific devices, signals and data structures are disclosed in order to more thoroughly understand the present invention. However, it will be apparent to one skilled in the art that the present invention may be practiced without these specific details. In other instances, well-known circuits, devices and data structures are not disclosed herein to avoid obscuring the present invention unnecessarily.

Figure 1:
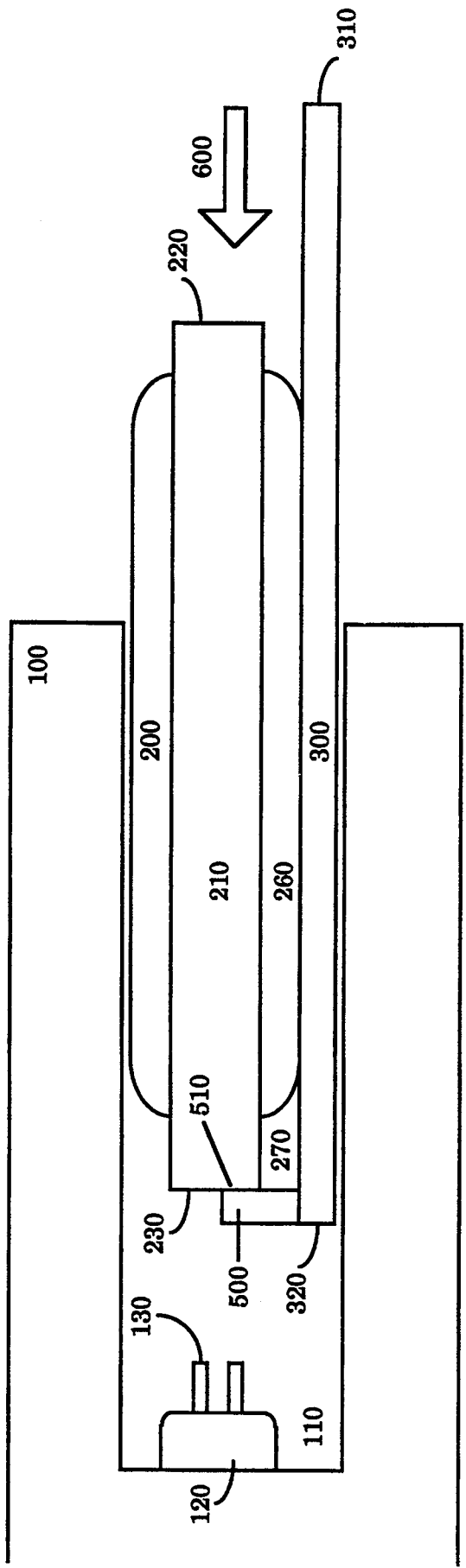
FIG. 1 illustrates a side view of a removable cartridge in an insertion/extraction position within a docking bay of an electronic component.

FIG. 1 illustrates a side view of a removable cartridge 200 in an insertion/extraction position within a docking bay 110 of an electronic component 100. Extraction tray 300 lies within docking bay 110 of electronic component 100. When removable cartridge 200 is to be inserted into docking bay 110, the distal end 230 of frame 210 is placed within an aperture of docking bay 110 and force 600 is applied to proximal end 220 of removable cartridge frame 210. Distal end 230 of frame 210 engages a frame engagement portion 510 of ejection tab 500 as removable cartridge 200 is inserted into the docking bay 110. Ejection tab 500 is affixed to distal end 320 of extraction tray 300 such that force 600 causes extraction tray 300 to move with removable cartridge 200 as the cartridge is inserted into the docking bay 110.

The removable cartridge 200 is inserted into docking bay 110 until it comes in contact with coupler 120 such that pins 130 extend into distal end 230 of removable cartridge 200 thereby coupling removable cartridge 200 to electronic component 100. Frame 210 extends beyond lower center area 260 of removable cartridge 200. Thus, when cartridge 200 is placed upon extraction tray 300, center area 260 rests upon tray 300 and gap 270 is formed between frame 210, center area 260, tray 300 and ejection tab 500. As will be described below in greater detail, pulling proximal end 310 of extraction tray 300 causes ejection tab 500 to assert a force on distal end 230 of frame 210 thereby causing removable cartridge 200 to uncouple from coupler 120. Removable cartridge 200 then slides along with extraction tray 300 to a position where removable cartridge 200 can be removed from electronic component 100 by grasping proximal end 220.

Figure 2:
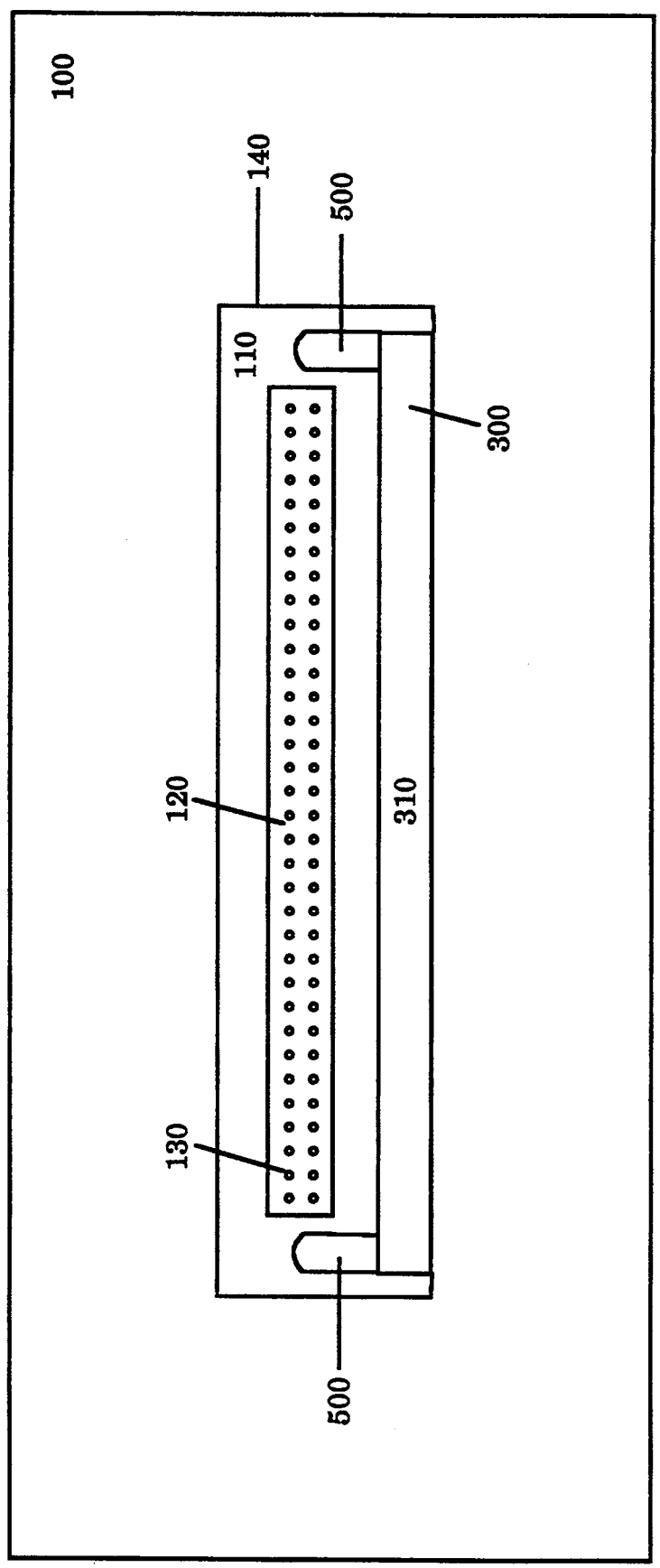
FIG. 2 illustrates the docking bay of the electronic component.

Referring to FIG. 2, the docking bay 110 of electronic component 100 is depicted. In FIG. 2, an end view of proximal end 310 of extraction tray 300 can be seen within docking bay aperture 140. In one embodiment of the present invention two ejection tabs 500 project perpendicularly from extraction tray 300. The ejection tabs 500 are attached to extraction tray 300 locations that permit the removable cartridge to couple with coupler 120. Coupler 120 has two rows of pins 130 which mate with the removable cartridge.

Note that ejection tab 500 engages distal end 230 of frame 210 but, because of gap 270, tab 500 does not engage lower, center area 260 of removable cartridge 200.

While the present invention is described in an embodiment which comprises two rows of pins 130, with each row having 34 pins, and in which two ejection tabs are employed, it will obvious to one skilled in the art that the present invention may be practiced with any number of pins 130 or ejection tabs 500. It will also be obvious that a coupling scheme other than pins 130 (e.g. spring-loaded clips) may be employed by coupler 120.

Figure 3:
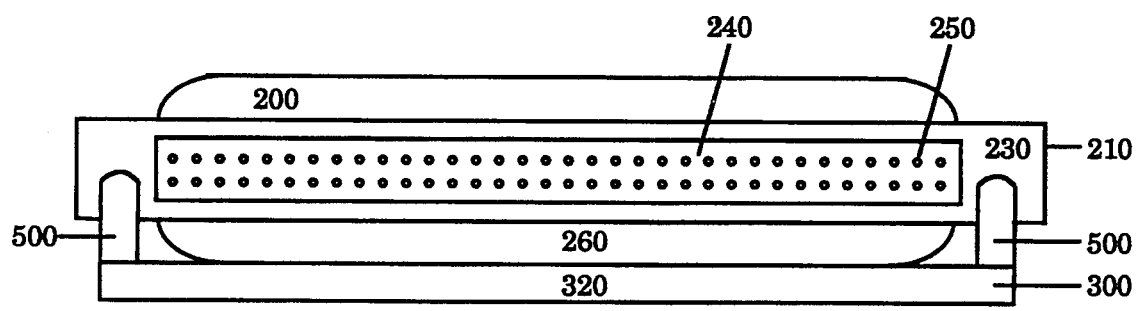
FIG. 3 illustrates an end view of the removable cartridge resting upon an extraction tray.

Referring to FIG. 3, an end view of the removable cartridge 200 resting upon the extraction tray 300 is depicted. Coupler 240 resides on distal end 230 of frame 210 of removable cartridge 200. Two rows of slots 250 are arranged within coupler 240 such that they will mate with the coupler of the electronic component when removable cartridge 200 resting upon lower, center area 260 has been inserted into the docking bay of the electronic component.

Ejection tabs 500 project from the distal end 320 of extraction tray 300 and are located such that the ejection tabs engage distal end 230 of frame 210 but do not interfere with coupler 240 when removable cartridge 200 is coupled to the electronic component.

Figure 4:
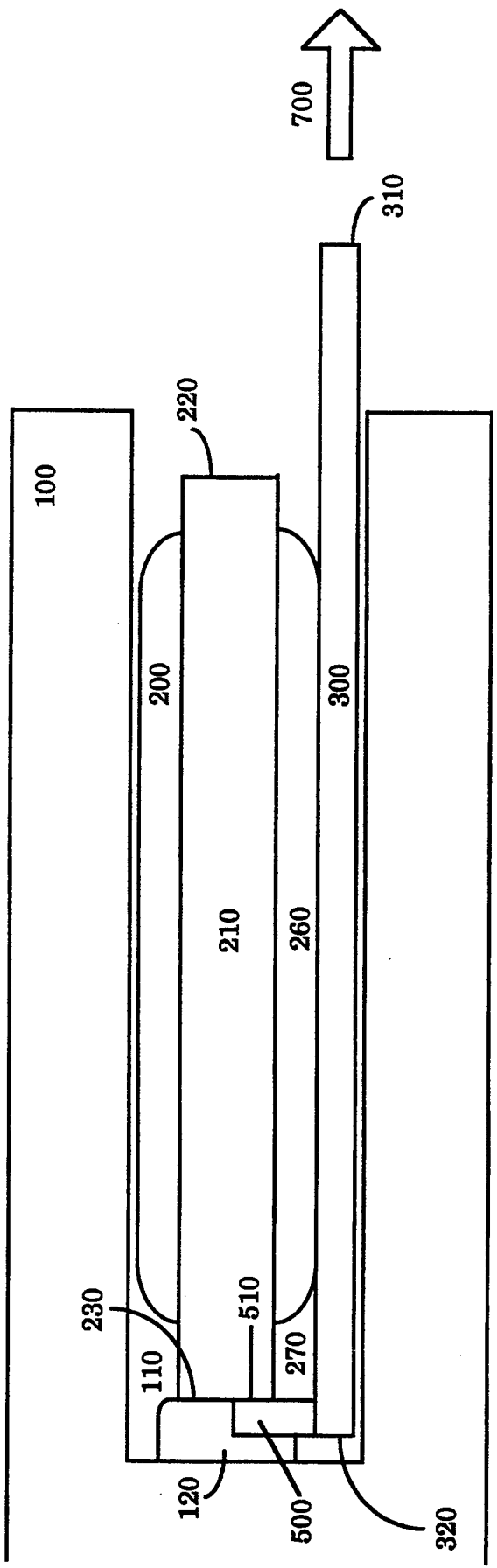
FIG. 4 illustrates a side view of the removable cartridge in an engaged position within the docking bay of the electronic component.

Referring now to FIG. 4, a side view of the removable cartridge 200 in an engaged position within the docking bay 110 of electronic component 100 is depicted. Pulling on proximal end 310 (of extraction tray 300) in the direction of force 700 causes frame engagement portion 510 of ejection tab 500 (which is attached to distal end 320 of extraction tray 300) to engage distal end 230 (of frame 210 of removable cartridge 200) and exert a force which uncouples removable cartridge 200 from coupler 120. Removable cartridge 200 then rides on extraction tray 300 to a position where proximal end 220 can be grasped for ultimate removal of removable cartridge 200 from electronic component 100.

Figure 5:
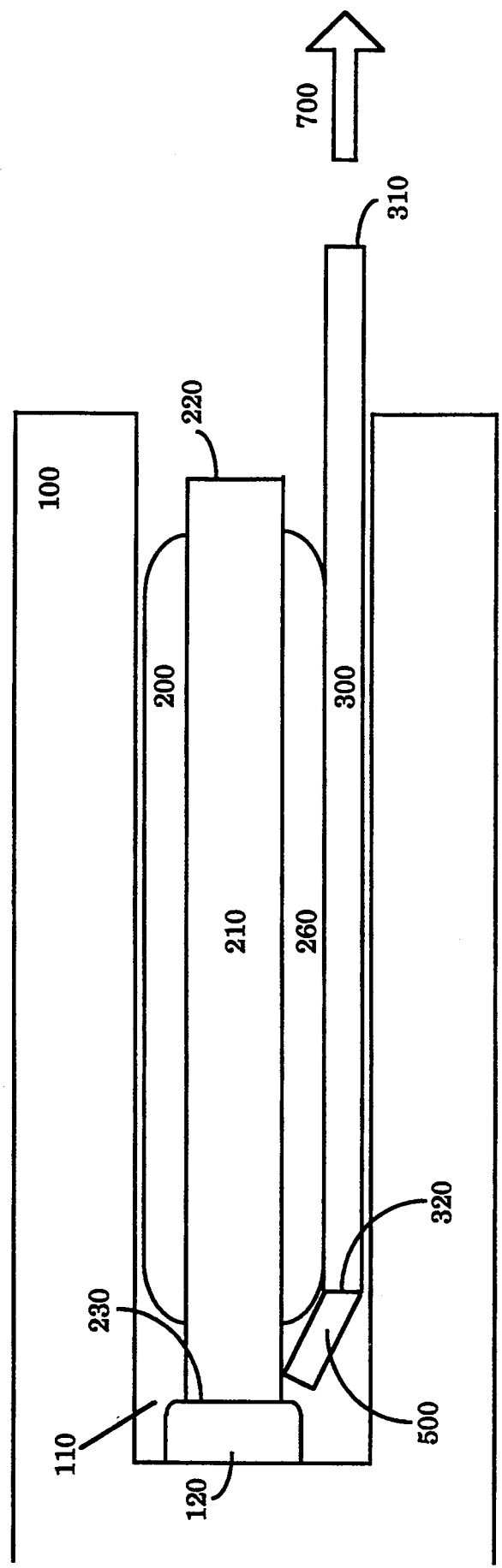
FIG. 5 illustrates the removable cartridge jammed within the docking bay after extraction tab failure during an attempt to remove the cartridge.

Referring to FIG. 5, ejection tab 500 failure causing the removable cartridge 200 to be jammed within the docking bay 110 is depicted. The ejection tab 500 failure occurred when force 700 was applied on proximal end 310 of extraction tray 300. The resistive force caused by engagement of coupler 120 to distal end 230 of frame 210 of removable cartridge 200 caused distal end 230 to exert a torque force upon ejection tab 500.

In FIG. 5, the moment arm of the torque force exerted on ejection tab 500 is caused by the gap between distal end 230 of frame 210 and distal end 320 of extraction tray 300. This moment arm can cause a torque force to be exerted upon ejection tab 500 of sufficient magnitude to bend ejection tab 500 where it joins extraction tray 300 at distal end 320. Frequently, when ejection tab 500 failure occurs, ejection tab 500 wedges against frame 210, thereby making removal of removable cartridge 200 from electronic component 100 impossible. Thus, ejection tab 500 failure can render an electronic component 100 unusable until the component 100 has been disassembled, removable cartridge 200 has been removed, and the extraction tray 300/ejection tab 500 assembly has been repaired or replaced.

Figure 6:
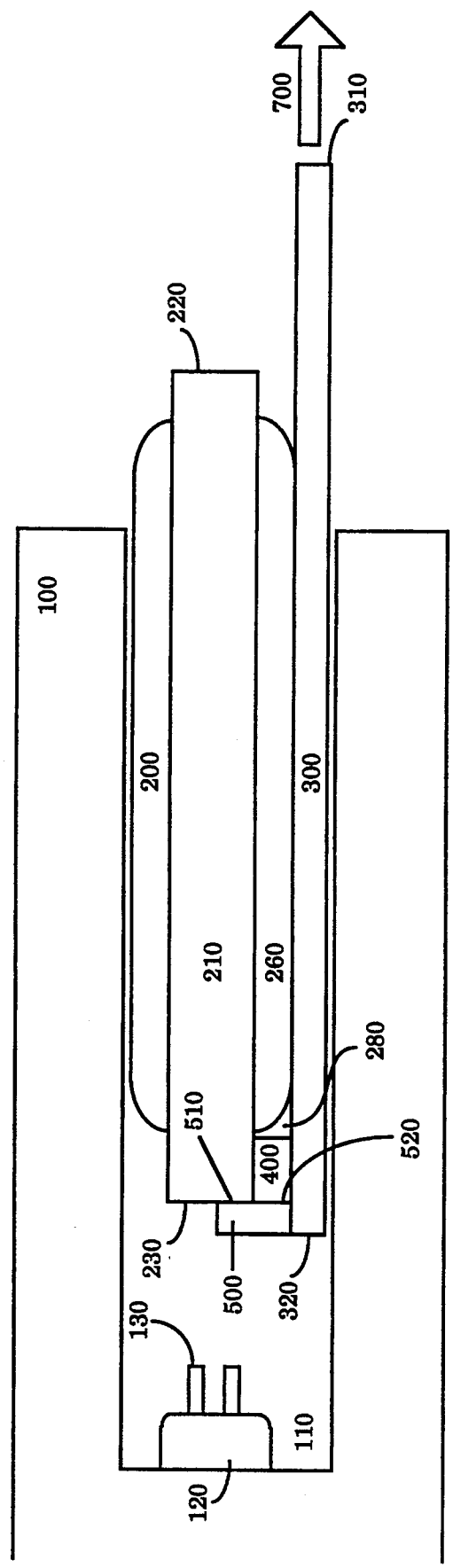
FIG. 6 illustrates a side view of a removable cartridge with a bull nose feature of the present invention.

Referring to FIG. 6, a side view of a removable cartridge 200 equipped with a bull nose feature of the present invention is depicted. In FIG. 6, bull nose adapter 400 has been attached to distal end 230 of frame 210 such that adapter 400 occupies a portion of gap 270, and in this embodiment, adapter 400 forms one side of smaller gap 280. Thus, adapter engagement portion 520 of ejection tab 500 exerts a force on bull nose adapter 400, and hence removable cartridge 200, when extraction tray 300 is pulled in direction 700 by proximal end 310.

By engaging ejection tab 500 in adapter engagement portion 520, bull nose adapter 400 decreases the moment arm of the force which ejection tab 500 exerts upon removable cartridge 200 when the cartridge is removed. Therefore, bull nose adapter 400 permits ejection tab 500 to exert a force sufficient to overcome the resistive force of pins 130 of coupler 120 and disengage removable cartridge 200 from electronic component 100 without causing ejection tab 500 failure.

In one embodiment of the present invention, bull nose adapter 400 is a strip of plastic that is affixed to frame 210 using an adhesive. In this embodiment, it is possible to inexpensively retrofit removable cartridges 200 which have a lower, center area 260 and therefore are prone to cause ejection tab 500 failure.

However, it will be obvious to one of ordinary skill in the art that an alternate embodiment of removable cartridge 200 would include bull nose adapter 400 as an integral part of frame 210.

Figure 8:
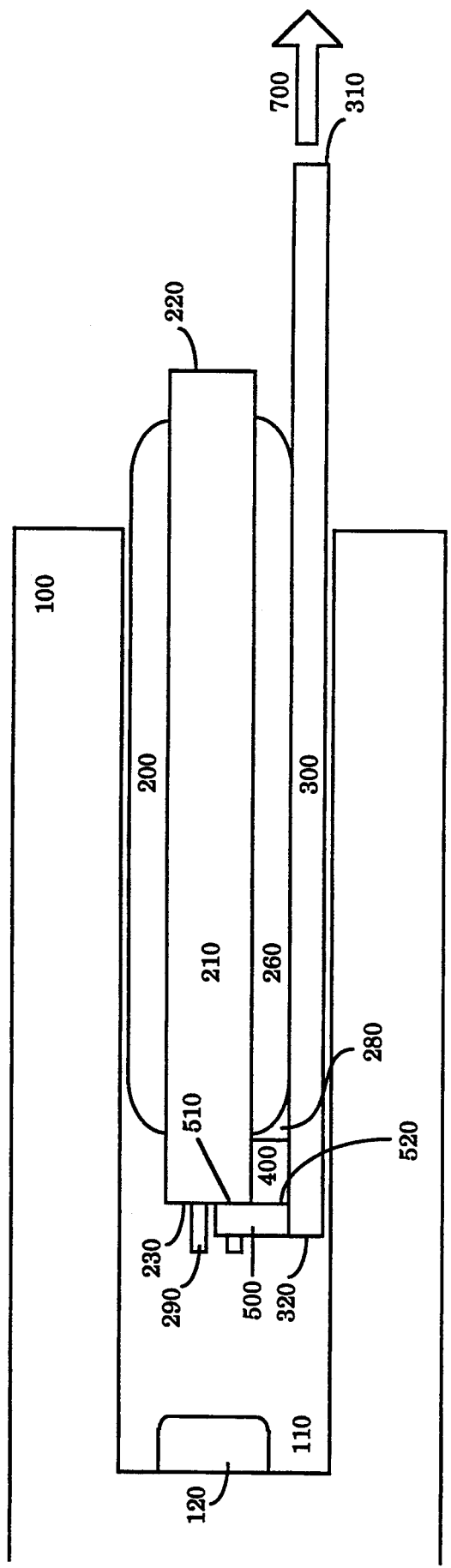
FIG. 8 illustrates a side view of an alternate embodiment of the present invention wherein pins extend from the distal end of a removable cartridge having a bull nose feature.

Furthermore, it will be obvious to one of ordinary skill in the art that in yet another embodiment of the present invention, ejection tab 500 need not engage distal end 230 of frame 210 at cartridge engagement portion 510. In this embodiment, ejection tab 500 would engage bull nose adapter 400 at adapter engagement portion 520 when removable cartridge 200 was being uncoupled from electronic component 100. Moreover, FIG. 8 illustrates yet another embodiment wherein pins 290 extend from distal end 230 of frame 210 and are received by corresponding slots of coupler 120.

Figure 7:
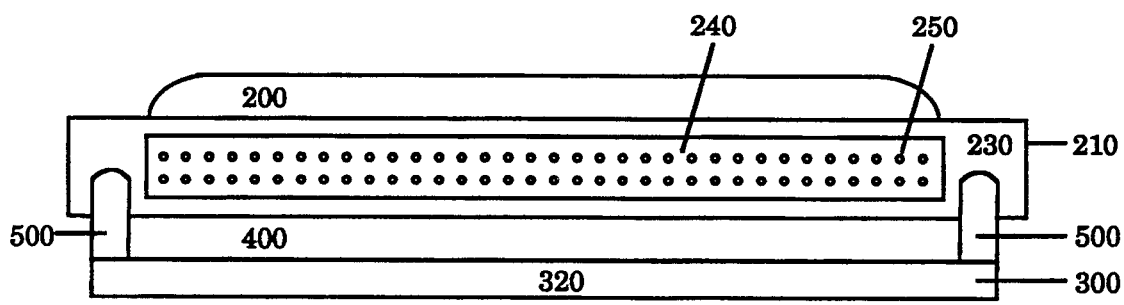
FIG. 7 illustrates an end view of a removable cartridge with a bull nose feature of the present invention.

Referring to FIG. 7, an end view of a removable cartridge 200 with a bull nose adapter 400 is depicted. In FIG. 7, the bull nose adapter 400 can be seen to be attached beneath frame 210 to the distal end 230 of removable cartridge 200. When installed in this position, the bull nose adapter 400 occupies a gap between frame 210 and distal end 320 of extraction tray 300. Filling the gap thusly causes the bull nose adapter 400 to engage ejection tabs 500 at the same time that the ejection tabs 500 engage distal end 230 of removable cartridge 200. Therefore, the cartridge ejection force exerted by ejection tabs 500 is distributed between bull nose adapter 400 and distal end 230 of removable cartridge 200. This distribution of forces reduces the moment arm of resistive torque forces exerted upon ejection tabs 500 and thereby significantly reduces the incidence of ejection tab 500 failure.

It will be obvious to one of ordinary skill in the art that, in an alternate embodiment of the present invention, bull nose adapter 400 could be replaced by a plurality of bull nose adapters equal in number to the number of ejection tabs 500. In this alternate embodiment, the bull nose adapters would be located beneath frame 210 in positions such that each bull nose adapter would engage a corresponding ejection tab 500 when the removable cartridge 200 was removed.

While the present invention has been particularly described with reference to FIGS. 6-7 and with emphasis on certain computer cartridges, it should be understood that the figures are for illustration purposes only and should not be taken as limitations upon the present invention. In addition, it is clear that the methods and apparatus of the present invention has utility in any application where a removable cartridge is to be extracted from a system component. It is contemplated that numerous alternatives, modifications, variations and uses may be made, by one skilled in the art, without departing from the spirit and scope of the invention as disclosed above.

What is claimed is:

1. A removable cartridge system for an electronic component, said component having a docking bay, said system comprising:

a removable cartridge, said docking bay having an aperture for receiving said cartridge;

an extraction tray, said tray having distal and proximal ends, said tray located at least partially within said docking bay and movable between a first position wherein said cartridge couples to said component and a second position wherein said cartridge can be removed through said docking bay aperture;

an ejection tab, said tab extending from said tray distal end;

first coupling means for coupling said cartridge to said component, said first coupling means coupled to said component and located a predetermined distance from said tray when said tray is in said first position;

said cartridge comprising:

(i) a frame having distal and proximal ends;

(ii) a lower center area upon which said cartridge rests when placed within said extraction tray, said distal end of said frame extending beyond said lower center area thereby forming a gap between said distal end of said frame, said lower center area, said ejection tab and said extraction tray such that said distal end of said frame does not lie upon said extraction tray when said cartridge is placed within said extraction tray;

(iii) second coupling means, said second coupling means located on said distal end of said frame, said first coupling means located within said bay such that said first and second coupling means together cooperate to couple said cartridge to said component when said frame distal end is inserted into said docking bay and said tray is in said first position; and adapter means coupled to said frame, said adapter means being disposed within at least a portion of said gap when said cartridge is placed within said extraction tray, said adapter means further having a tab engagement edge substantially parallel to said tab when said cartridge is placed within said extraction tray, said tab having an adapter engagement portion such that said adapter engagement portion exerts a first force on said tab engagement edge of said adapter means when said tray moves from said first to said second position, said first force having sufficient magnitude and direction to uncouple said first and second coupling means, but said first force does not exert a first moment upon said tab sufficient to cause said tab to bend.

2. The system as set forth in claim 1 wherein said ejection tab is comprised of a plurality of ejection members.

3. The system as set forth in claim 1 wherein said second coupling means comprises at least one pin and said first coupling means comprises at least one slot, each said pin having a corresponding said slot.

4. The system as set forth in claim 1 wherein said first coupling means comprises at least one pin and said second coupling means comprises at least one slot, each said pin having a corresponding said slot.

5. The system as set forth in claim 1 wherein engagement portion does not engage said frame such that said second force said tab further engages said frame distal end when said tray moves from said first to said second position, such that, when said tray is moved from said first to said second position, a cartridge engagement portion of said tab exerts a second force on said frame distal end, said first and second forces together having sufficient magnitude and direction to uncouple said first and second coupling means, but said first and second forces do not together exert a second moment upon said tab sufficient to cause said tab to bend.

6. A removable cartridge for an electronic component, said component having a docking bay, first coupling means for coupling said cartridge to said component, an extraction tray and an ejection tab, said tray having distal and proximal ends, said tab extending from said tray distal end, said docking bay having an aperture for receiving said cartridge, said tray located at least partially within said docking bay and movable between a first position wherein said cartridge couples to said component and a second position wherein said cartridge can be removed through said docking bay aperture, said first coupling means located a predetermined distance from said tray when said tray is in said first position, said cartridge comprising:

a frame having distal and proximal ends;

a lower center area upon which said cartridge rests when placed within said extraction tray, said distal end of said frame extending beyond said lower center area thereby forming a gap between said distal end of said frame, said lower center area, said ejection tab and said extraction tray such that said distal end of said frame does not lie upon said extraction tray when said cartridge is placed within said extraction tray;

second coupling means, said second coupling means located on said distal end of said frame, said first coupling means located within said bay such that said first and second coupling means together cooperate to couple said cartridge to said component when said frame distal end is inserted into said docking bay and said tray is in said first position; and adapter means coupled to said frame, said adapter means being disposed within at least a portion of said gap when said cartridge is placed within said extraction tray, said adapter means further having a tab engagement edge substantially parallel to said tab when said cartridge is placed within said extraction tray, said tab having an adapter engagement portion such that said adapter engagement portion exerts a first force on said tab engagement edge of said adapter means when said tray moves from said first to said second position, said first force having sufficient magnitude and direction to uncouple said first and second coupling means, but said first force does not exert a sufficient first moment upon said tab to cause said tab to bend.

7. The cartridge as set forth in claim 6 wherein said ejection tab is comprised of a plurality of ejection members, said tab further engages said frame distal end when said tray moves from said first to said second position, such that, when said tray is moved from said first to said second position, a cartridge engagement portion of said tab exerts a second force on said frame distal end, said first and second forces together having sufficient magnitude and direction to uncouple said first and second coupling means, but said first and second forces do not together exert a second moment upon said tab sufficient to cause said tab to bend.

8. The cartridge as set forth in claim 6 wherein said second coupling means is at least one pin and said first coupling means is at least one slot, each said pin having a corresponding said slot.

9. The cartridge as set forth in claim 6 wherein said first coupling means is at least one pin and said second coupling means is at least one slot, each said pin having a corresponding said slot.

10. The cartridge as set forth in claim 6 wherein said tab further engages said frame distal end when said tray moves from said first to said second position, such that, when said tray is moved from said first to said second position, a cartridge engagement portion of said tab exerts a second force on said frame distal end, said first and second forces together having sufficient magnitude and direction to uncouple said first and second coupling means, but said first and second forces do not together exert a second moment upon said tab sufficient to cause said tab to bend.

11. A removable cartridge for an electronic component, said component having a docking bay, a first coupler, an extraction tray and an ejection tab, said tray having distal and proximal ends, said tab extending perpendicularly from said tray distal end, said docking bay having an aperture for receiving said cartridge, said tray located at least partially within said docking bay and movable between a first position wherein said cartridge couples to said component and a second position wherein said cartridge can be removed through said docking bay aperture, said first coupler located a predetermined distance from said tray when said tray is in said first position, said cartridge comprising:

a frame having distal and proximal ends;

a lower center area upon which said cartridge rests when placed within said extraction tray, said distal end of said frame extending beyond said lower center area thereby forming a gap between said distal end of said frame, said lower center area, said ejection tab and said extraction tray such that said distal end of said frame does not lie upon said extraction tray when said cartridge is placed within said extraction tray;

a second coupler, said second coupler located on said distal end of said frame, said first coupler located within said bay such that said first and second couplers cooperate to couple said cartridge to said component when said frame distal end is inserted into said docking bay and said tray is in said first position; and a bull nose adapter coupled to said frame, said adapter being disposed within at least a portion of said gap when said cartridge is placed within said extraction tray, said adapter further having a tab engagement edge substantially parallel to said tab when said cartridge is placed within said extraction tray, said tab having an adapter engagement portion located between said frame engagement portion and said tray such that said adapter engagement portion exerts a first force on said tab engagement edge of said adapter when said tray moves from said first to said second position, said first force having sufficient magnitude and direction to uncouple said first and second couplers, but said first force does not exert a sufficient first moment upon said tab to cause said tab to bend.

12. The cartridge as set forth in claim 11 wherein said ejection tab is comprised of a plurality of ejection members, said tab further engages said frame distal end when said tray moves from said first to said second position, such that, when said tray is moved from said first to said second position, a cartridge engagement portion of said tab exerts a second force on said frame distal end, said first and second forces together having sufficient magnitude and direction to uncouple said first and second coupling means, but said first and second forces do not together exert a second moment upon said tab sufficient to cause said tab to bend.

13. The cartridge as set forth in claim 11 wherein said second coupler comprises at least one pin and said first coupler comprises at least one slot, each said pin having a corresponding said slot.

14. The cartridge as set forth in claim 11 wherein said first coupler comprises at least one pin and said second coupler comprises at least one slot, each said pin having a corresponding said slot.

15. The cartridge as set forth in claim 11 wherein said tab further engages said frame distal end when said tray moves from said first to said seconded position, such that, when said tray is moved from said first to said second position, a cartridge engagement portion of said tab exerts a second force on said frame distal end, said first and second forces together having sufficient magnitude and direction to uncouple said first and second couplers, but said first and second forces do not together exert a second moment upon said tab sufficient to cause said tab to bend.

16. A method of uncoupling a cartridge from an electronic component, said component comprising first coupling means, an extraction tray and a docking bay, said extraction tray having distal and proximal ends and an ejection tab extending perpendicularly from said tray distal end, said docking bay having an aperture for receiving said cartridge, said cartridge comprising a frame and second coupling means, said frame having distal and proximal ends and second coupling means located on said distal end of said frame, said tray located at least partially within said docking bay and movable between a first position wherein said cartridge couples to said component and a second position wherein said cartridge can be removed through said docking bay aperture, said first coupling means located within said bay such that said first and second coupling means together cooperate to couple said cartridge to said component when said cartridge is inserted into said docking bay and said tray is in said first position, said method comprising the steps of:

coupling adapter means to said frame distal end, said cartridge having a lower center area upon which said cartridge rests when said cartridge is placed within said extraction tray, said distal end of said frame extending beyond said lower center area thereby forming a gap between said distal end of said frame, said lower center area, said ejection tab and said extraction tray such that said distal end of said frame does not lie upon said extraction tray when said cartridge is placed within said extraction tray, said adapter means being disposed within at least a portion of said gap when said cartridge is placed within said extraction tray, said adapter means further having a tab engagement edge substantially parallel to said tab when said cartridge is placed within said extraction tray and said extraction tray is in said first position; and moving said tray from said first position to said second position when said cartridge is placed within said extraction tray and said extraction tray is in said first position, said tab having an adapter engagement portion such that said adapter engagement portion exerts a first force on said tab engagement edge of said, adapter means when said tray moves from said first to said second position, said first force having sufficient magnitude and direction to uncouple said first and second coupling means, but said first force not exerting a sufficient first moment upon said tab to cause said tab to bend.

17. The method as set forth in claim 16 wherein, when said cartridge is placed within said extraction tray and said extraction tray is moved from said first position to said second position, said a cartridge engagement portion of said tab further engages said frame distal end, such that said cartridge engagement portion exerts a second force on said frame distal end, said first and second forces together having sufficient magnitude and direction to uncouple said first and second coupling means, but said first and second forces do not together exert a second moment upon said tab sufficient to cause said tab to bend.

* * * * *

UNITED STATES PATENT AND TRADEMARK OFFICE
CERTIFICATE OF CORRECTION

PATENT NO. : 5,337,213
DATED : Aug. 9, 1994
INVENTOR(S) : Philip J. Agur

It is certified that error appears in the above-indentified patent and that said Letters Patent is hereby corrected as shown below:

Column 10, line 36, delete ","

Signed and Sealed this

Fifth Day of December, 1995

Attest:

Attesting Officer

BRUCE LEHMAN

Commissioner of Patents and Trademarks